US006632692B1

(12) United States Patent
Hewett et al.

(10) Patent No.: US 6,632,692 B1
(45) Date of Patent: Oct. 14, 2003

(54) AUTOMATED METHOD OF CONTROLLING CRITICAL DIMENSIONS OF FEATURES BY CONTROLLING STEPPER EXPOSURE DOSE, AND SYSTEM FOR ACCOMPLISHING SAME

(75) Inventors: Joyce S. Oey Hewett, Austin, TX (US); Alexander J Pasadyn, Austin, TX (US); Anthony J. Toprac, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 243 days.

(21) Appl. No.: 09/758,765

(22) Filed: Jan. 11, 2001

(51) Int. Cl.[7] .............................................. H01L 21/66
(52) U.S. Cl. ...................................................... 438/18
(58) Field of Search ............................... 430/328, 311, 430/30; 356/504; 359/637; 280/10; 438/18

(56) References Cited

U.S. PATENT DOCUMENTS

| | | | |
|---|---|---|---|
| 5,629,772 A | | 5/1997 | Ausschnitt ................... 365/372 |
| 5,655,110 A | | 8/1997 | Krivokapic et al. ......... 395/500 |
| 5,773,174 A | | 6/1998 | Koizumi et al. .............. 430/30 |
| 5,926,690 A | | 7/1999 | Toprac et al. ................. 438/17 |
| 5,994,009 A | * | 11/1999 | Tzu .............................. 430/30 |
| 6,208,469 B1 | * | 3/2001 | Matsuura ..................... 359/637 |
| 6,252,670 B1 | * | 6/2001 | Sheng ......................... 356/504 |
| 6,388,253 B1 | * | 5/2002 | Su ............................... 250/10 |

OTHER PUBLICATIONS

Hankinson et al., "Integrated Real-time and Run-to-Run Control of Etch Depth in Reactive Ion Etching," pp. 1–17, Mar. 13, 1996.

Boning et al., "Practical Issues in Run by Run Process Control," 1995 IEEE/SEMI Advanced Semiconductor Manufacturing Conference, pp. 201–208, 1995.

Zafiriou et al., "Nonlinear Model Based Run–to–Run Control for Rapid Thermal Processing with Unmeasured Variable Estimation," 187th ECS Meeting, Reno, NV, May 1995.

Boning et al., "Run by Run Control of Chemical–Mechanical Polishing," IEEE/CHMT International Electronics Manufacturing Technology Symposium, Austin, Texas, Oct. 2–4, 1995.

Smith et al., "Compensating for CMP Pad Wear Using Run by Run Feedback Control," VMIC, Santa Clara, CA, Jun. 18–20, 1996.

Sachs et al., "Process Control System for VLSI Fabrication," IEEE Transactions on Semiconductor Manufacturing, pp. 1–31, Apr. 5, 1990.

* cited by examiner

*Primary Examiner*—John F. Niebling
*Assistant Examiner*—André Stevenson
(74) *Attorney, Agent, or Firm*—Williams, Morgan & Amerson, P.C.

(57) ABSTRACT

The present invention is directed to an automated method of controlling critical dimensions of features by controlling the stepper exposure dose, and a system for accomplishing same. In one embodiment, the method comprises measuring a critical dimension (FICD) of a plurality of features formed in a process layer, and providing the measured critical dimensions of the features to a controller that determines, based upon the measured critical dimensions, an exposure dose of an exposure process to be performed on at least one subsequently processed wafer. In another embodiment, the method comprises measuring a critical dimension (DICD) of a plurality of features formed in a patterned layer of photoresist, providing the measured critical dimensions of the features in the patterned layer of photoresist to a controller that determines, based upon the measured critical dimensions, an exposure dose of an exposure process to be performed on at least one subsequently processed wafer. In some embodiments, both the FICD measurements and the DICD measurements are used to determine the exposure dose.

11 Claims, 5 Drawing Sheets

AUTOMATED METHOD OF CONTROLLING CRITICAL DIMENSIONS OF FEATURES BY CONTROLLING STEPPER EXPOSURE DOSE, AND SYSTEM FOR ACCOMPLISHING SAME

BACKGROUND OF THE INVENTION

1. Field of the Invention

This invention relates generally to semiconductor fabrication technology, and, more particularly, to an automated method of controlling critical dimensions of features by controlling the exposure dose of an exposure process performed in a stepper tool, and system for accomplishing same.

2. Description of the Related Art

There is a constant drive within the semiconductor industry to increase the operating speed of integrated circuit devices, e.g., microprocessors, memory devices, and the like. This drive is fueled by consumer demands for computers and electronic devices that operate at increasingly greater speeds. This demand for increased speed has resulted in a continual reduction in the size of semiconductor devices, e.g., transistors. That is, many components of a typical field effect transistor (FET), e.g., channel length, junction depths, gate insulation thickness, and the like, are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

Figure 1:
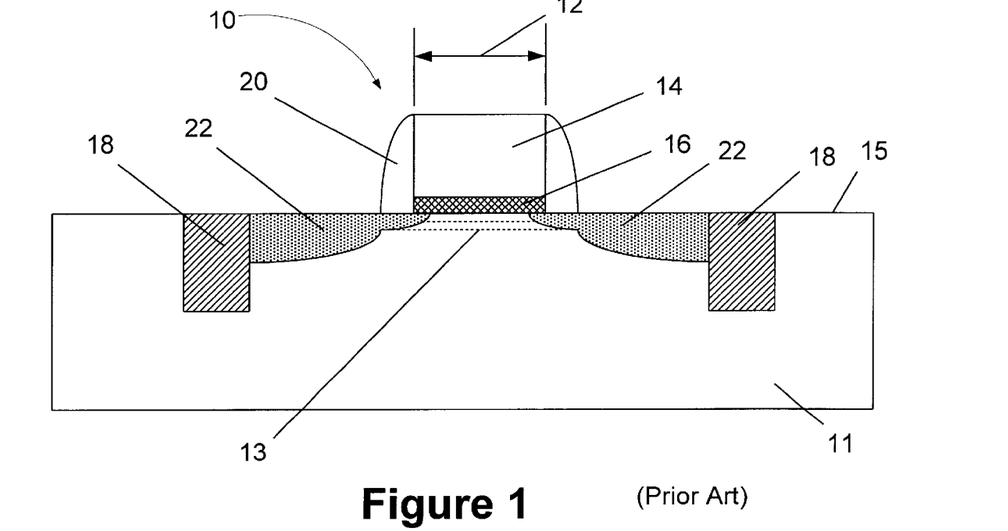
FIG. 1 is a cross-sectional view of an illustrative prior art transistor.

By way of background, an illustrative field effect transistor 10, as shown in FIG. 1, may be formed above a surface 15 of a semiconducting substrate or wafer 11, such as doped-silicon. The substrate 11 may be doped with either N-type or P-type dopant materials. The transistor 10 may have a doped-polycrystalline silicon (polysilicon) gate electrode 14 formed above a gate insulation layer 16. The gate electrode 14 and the gate insulation layer 16 may be separated from doped source/drain regions 22 of the transistor 10 by a dielectric sidewall spacer 20. The source/drain regions 22 for the transistor 10 may be formed by performing one or more ion implantation processes to introduce dopant atoms, e.g., arsenic or phosphorous for NMOS devices, boron for PMOS devices, into the substrate 11. Shallow trench isolation regions 18 may be provided to isolate the transistor 10 electrically from neighboring semiconductor devices, such as other transistors (not shown).

The gate electrode 14 has a critical dimension 12, i.e., the width of the gate electrode 14, that approximately corresponds to the channel length 13 of the device when the transistor 10 is operational. Of course, the critical dimension 12 of the gate electrode 14 is but one example of a feature that must be formed very accurately in modem semiconductor manufacturing operations. Other examples include, but are not limited to, conductive lines, openings in insulating layers to allow subsequent formation of a conductive interconnection, i.e., a conductive line or contact, therein, etc.

In the process of forming integrated circuit devices, millions of transistors, such as the illustrative transistor 10 depicted in FIG. 1, are formed above a semiconducting substrate. In general, semiconductor processing involves the formation of layers of various materials, e.g., polysilicon, insulating materials, etc., and selectively removing portions of those layers by performing known photolithographic and etching techniques. These processes are continued until such time as the integrated circuit device is complete. Additionally, although not depicted in FIG. 1, a typical integrated circuit device is comprised of a plurality of conductive interconnections, such as conductive lines and conductive contacts or vias, positioned in multiple layers of insulating material formed above the substrate. These conductive interconnections allow electrical signals to propagate between the transistors formed above the substrate.

During the course of fabricating such integrated circuit devices, a variety of features, e.g., gate electrodes, conductive lines, openings in layers of insulating material, etc., must be formed to very precisely controlled dimensions. Such dimensions are sometimes referred to as the critical dimension (CD) of the feature. It is very important in modern semiconductor processing that features be formed as accurately as possible due to the reduced size of those features in such modem devices. For example, gate electrodes may now be patterned to a width 12 that is approximately 0.2 $\mu$m (2000 Å), and further reductions are planned in the future. In general, the width 12 of the gate electrode 14 corresponds approximately to the channel length 13 of the transistor 10 when it is operational. Thus, even slight variations in the actual dimension of the feature as fabricated may adversely affect device performance. Moreover, it is also desirable that manufacturing operations produce such features in a consistent, reliable and predictable manner. That is, it is desirable that features be formed in a manner such that there is little variation in final feature sizes, despite forming millions of such features on different substrates using different process tools to form such features.

In modem semiconductor fabrication facilities, a variety of factors may tend to cause variations in the size of fabricated structures or features, as compared to the intended or design size of those features. For example, photolithography is a process typically employed in semiconductor manufacturing. Photolithography generally involves forming a patterned layer of photoresist above a layer of material that is desired to be patterned using the patterned photoresist layer as a mask. In general, in photolithography operations, the pattern desired to be formed on the underlying layer of material is initially formed on a reticle. Thereafter, using an appropriate stepper tool and known photolithographic techniques, the image on the reticle is transferred to the layer of photoresist. Then, the layer of photoresist is developed so as to leave in place a patterned layer of photoresist reflecting the pattern on the reticle. This patterned layer of photoresist is then used as a mask in subsequent etching processes, wet or dry, performed on the underlying layer of material, e.g., a layer of polysilicon, metal or insulating material, to transfer the desired pattern to the underlying layer.

However, for a variety of reasons, the photolithography process often introduces some errors between the size of the image or feature as formed on the reticle, and the resulting image or feature as formed in the patterned layer of photoresist. Such errors may be due to a variety of factors, such as degradation or damage to the light source of the stepper tool, the positioning of the layer of photoresist relative to a light source, lens degradation or tool vibration, etc. Such factors may lead to the formation of a patterned layer of photoresist in which the critical dimensions of the feature in the patterned layer of photoresist are less than or greater than a desired target value. As a result of such variations, features may be formed in the underlying layer of material that have critical dimensions that are greater than or less than the desired feature sizes. Moreover, such variations may also be different depending upon which stepper tool is used in the process.

Variations in etching processes and equipment may also cause variations in the critical dimension of features on integrated circuit devices. For example, due to a variety of factors, an etching tool, or type of etching tool, may not etch the underlying process layer exactly in correspondence with the patterned layer of photoresist formed thereabove. That is, the etching process may result in the underlying feature in the process layer having a critical dimension that is greater than or less than the critical dimension of the feature formed in the patterned layer of photoresist. Such variations may result from a variety of factors, e.g., the cleanliness of the etching tool, any recent maintenance procedures performed on the tool, defective tool performance, variations in process recipe or constituent gases, etc.

Given the continual reduction of feature sizes in modern integrated circuit devices, it continues to be very important that feature sizes be defined as accurately as possible, and that such processes be repeatable. Thus, a need exists for a method and system that allows for automated control of the formation of critical feature dimensions in modern integrated circuit devices. The present invention is directed to a method and system that solves, or reduces, some or all of the aforementioned problems.

SUMMARY OF THE INVENTION

The present invention is directed to an automated method of controlling critical dimensions of features by controlling the stepper exposure dose, and a system for accomplishing same. In general, the present invention involves measuring a critical dimension of a plurality of features formed in a process layer (FICD dimension) and/or measuring a critical dimension of a plurality of features formed in a patterned layer of photoresist (DICD dimension) and using, individually or collectively, the FICD dimensions and the DICD dimensions to determine an exposure dose of an exposure process to be performed by a stepper tool or subsequently processed wafers.

In one illustrative embodiment, the method comprises measuring a critical dimension of a plurality of features formed in a process layer formed on a wafer, providing the measured critical dimensions of the features in the process layer to a controller that determines, based upon the measured critical dimensions, an exposure dose of an exposure process to be performed on at least one subsequently processed wafer, forming a layer of photoresist above a process layer formed above said subsequently processed wafer, and performing the exposure process on the layer of photoresist on the subsequently processed wafer using the determined exposure dose.

In another illustrative embodiment, the method comprises measuring a critical dimension of a plurality of features formed in a patterned layer of photoresist that is formed above a process layer formed on a wafer, providing the measured critical dimensions of the features in the patterned layer of photoresist to a controller that determines, based upon the measured critical dimensions, an exposure dose of an exposure process to be performed on at least one subsequently processed wafer, forming a layer of photoresist above a process layer formed above a subsequently processed wafer, and performing the exposure process on the layer of photoresist on the subsequently processed wafer using the determined exposure dose.

In yet another illustrative embodiment, the method comprises measuring a critical dimension of a plurality of features formed in a patterned layer of photoresist that is formed above a process layer formed on a wafer, measuring a critical dimension of a plurality of features formed in a process layer formed on a wafer, providing the measured critical dimensions of the features in the patterned layer of photoresist and the features in the process layer to a controller that determines, based upon the measured critical dimensions, an exposure dose of an exposure process to be performed on at least one subsequently processed wafer, forming a layer of photoresist above a process layer formed above a subsequently processed wafer, and performing the exposure process on the layer of photoresist on the subsequently processed wafer using the determined exposure dose.

In one illustrative embodiment, the system disclosed herein comprises a metrology tool for determining a critical dimension of a plurality of features 23A, 27A formed in a process layer 23 formed on a wafer, a controller that determines, based upon the measured critical dimensions of the features, an exposure dose of an exposure process to be performed on at least one subsequently processed wafer, and a stepper tool that performs the exposure process on the at least one subsequently processed wafer using the determined exposure dose. In another embodiment, critical dimensions of a plurality of features 25A, 27 formed in a patterned layer of photoresist are provided to the controller 38, and those critical dimensions, alone or in addition to the critical dimensions of the process layer, are used to determine the exposure dose on subsequent wafers.

BRIEF DESCRIPTION OF THE DRAWINGS

The invention may be understood by reference to the following description taken in conjunction with the accompanying drawings, in which like reference numerals identify like elements, and in which.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Although the various regions and structures of a semiconductor device are depicted in the drawings as having very precise, sharp configurations and profiles, those skilled in the art recognize that, in reality, these regions and structures are not as precise as indicated in the drawings. Additionally, the relative sizes of the various features and doped regions depicted in the drawings may be exaggerated or reduced as compared to the size of those features or regions on fabricated devices. Nevertheless, the attached drawings are included to describe and explain illustrative examples of the present invention.

In general, the present invention is directed to an automated method of controlling critical dimensions of features by controlling stepper exposure dose, and system for accomplishing same. As will be readily apparent to those skilled in the art upon a complete reading of the present application, the present method is applicable to a variety of technologies, e.g., NMOS, PMOS, CMOS, etc., is readily applicable to a variety of devices, including, but not limited to, logic devices, memory devices, etc.

Semiconductor manufacturing generally involves multiple processes whereby multiple layers of material are formed above a semiconducting substrate, and portions of those layers are selectively removed until such time as a completed device is formed. In general, photolithography involves the process of forming a layer of photoresist material above a process layer in which a feature, e.g., a metal line, a gate electrode, an opening in a layer of insulating material, will be formed. Thereafter, a pattern that is desired to be transferred into the underlying process layer will be formed in the layer of photoresist material. Then, using one or more etching processes, the underlying process layer is etched using the patterned layer of photoresist as a mask, thereby resulting in a patterned process layer that replicates the pattern formed in the layer of photoresist.

Figure 2A:
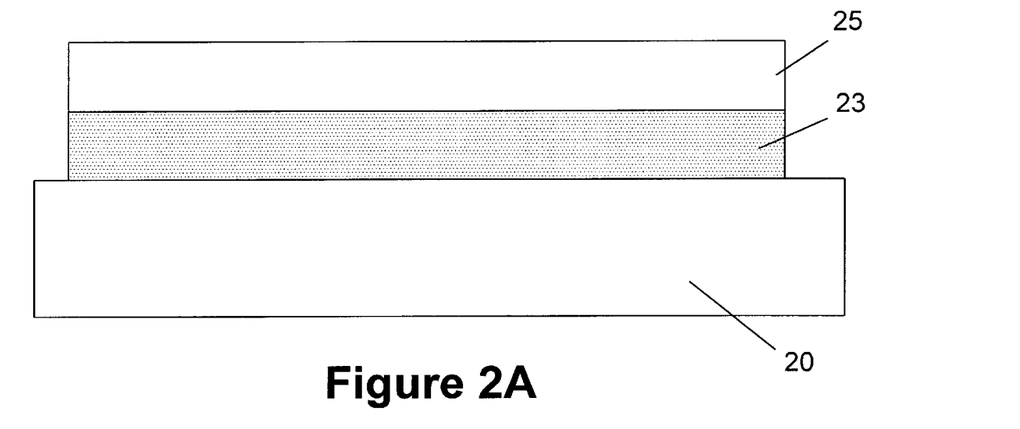
FIGS. 2A–2D are cross-sectional views depicting patterning operations performed on an illustrative wafer having a layer of photoresist and a process layer formed thereabove.

This process will be further described with reference to FIGS. 2A–2D. As shown in FIG. 2A, a process layer 23 is formed above a structure 20, and a layer of photoresist material 25 is formed above the process layer 23. As will be readily apparent to those skilled in the art after reading the present application, the structure 20 may be a semiconducting substrate, e.g., silicon, or it may represent one or more previously formed layers of material above such a semiconducting substrate, i.e., a stack of insulating layers each having a plurality of conductive interconnections formed therein. Similarly, the process layer 23 may be comprised of any type of material commonly encountered in semiconducting processing, e.g., it may be a layer of polysilicon, a layer of metal, e.g., aluminum, or it may be a layer of insulating material, e.g., a layer of silicon dioxide, HSQ, a layer of material having a dielectric constant greater than 3, etc. Moreover, the process layer 23 may be formed by a variety of techniques, e.g., chemical vapor deposition (CVD), physical vapor deposition (PVD), thermal growth, etc., and the thickness of the process layer 23 may vary greatly. Similarly, the layer of photoresist 25 may be either a positive or negative type photoresist, and it may be formed by a variety of techniques, e.g., a variety of spin-coating techniques commonly employed in modern semiconductor manufacturing.

Figure 2B:
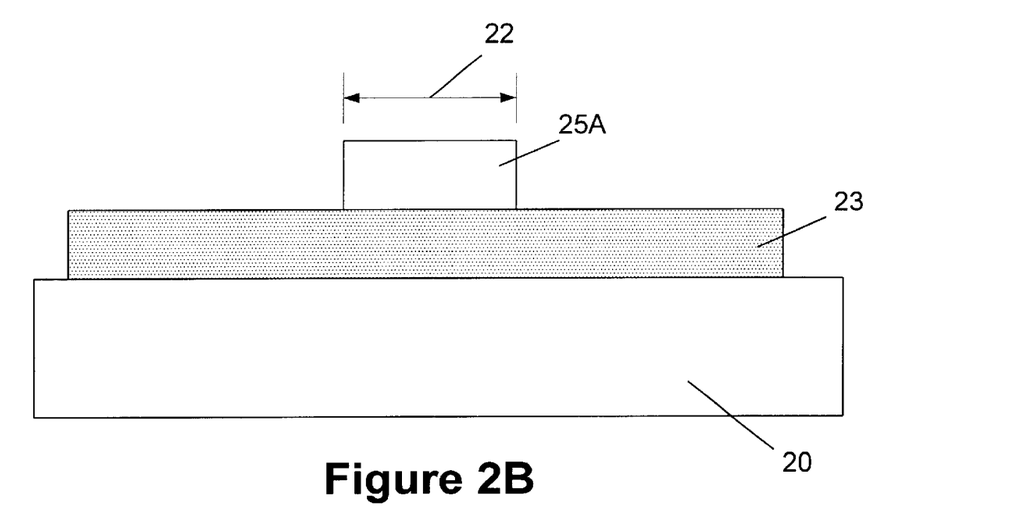

Next, as shown in FIG. 2B, the layer of photoresist 25 is patterned using known photolithography techniques to define a plurality of photoresist features 25A (only one of which is shown) above the process layer 23. In the embodiment depicted in FIG. 2B, the photoresist feature 25A is essentially an island of photoresist material that will be used as a mask in subsequent etching processes whereby a corresponding feature will be formed in the underlying process layer 23. Of course, and as will be apparent to those skilled in the art upon a complete reading of the present application, the present invention may be used in both forming lines and/or openings in the underlying process layer 23. The photoresist feature 25A has a critical dimension 22. This is sometimes referred to in the industry as a developinspect critical dimension (DICD), as it represents the critical dimension of the feature 25A after the photoresist has been completely developed.

Figure 2C:
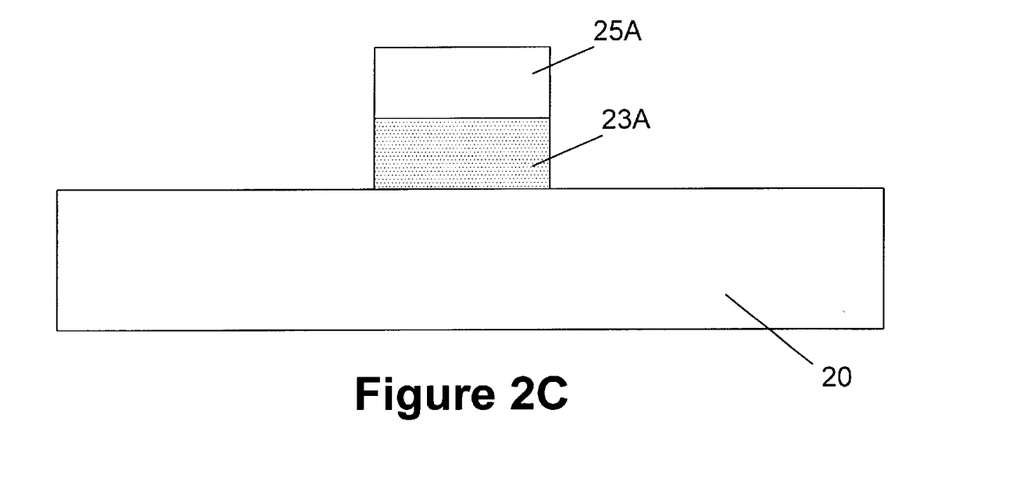
Figure 2D:
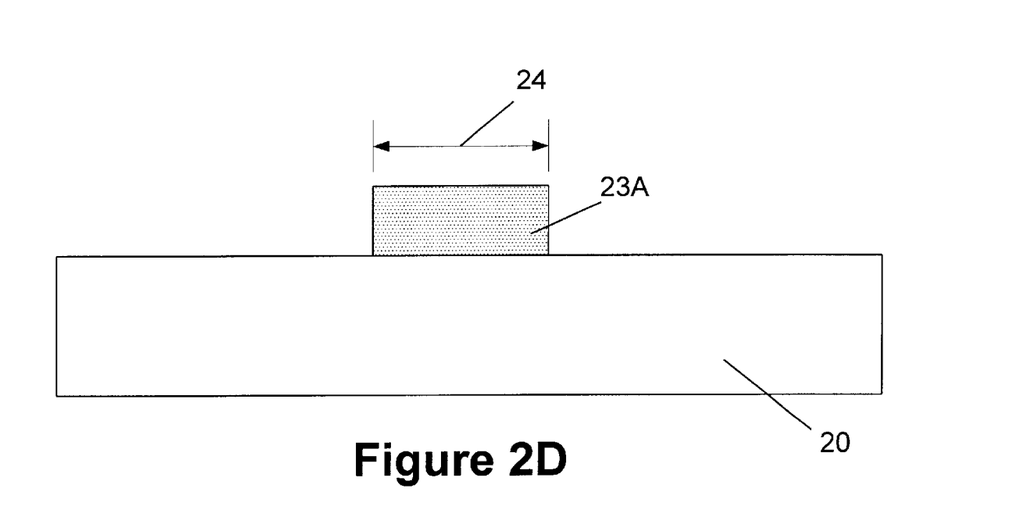

Then, as shown in FIG. 2C, one or more etching processes are performed, using the photoresist feature 25A as a mask, to result in the definition of a feature 23A in the process layer 23. As set forth previously, in the depicted embodiment shown in FIGS. 2A–2D, the feature 23A may represent a conductive line, a gate electrode for a transistor, or other such features commonly found on an integrated circuit device. Then, as shown in FIG. 2D, the photoresist feature 25A may be removed using known techniques. The remaining feature 23A formed in the process layer 23 has a critical dimension 24. This critical dimension 24 is sometimes referred to as the final-inspect critical dimension (FICD), as it reflects the final measured critical dimension of the as-fabricated feature.

Figure 3A:
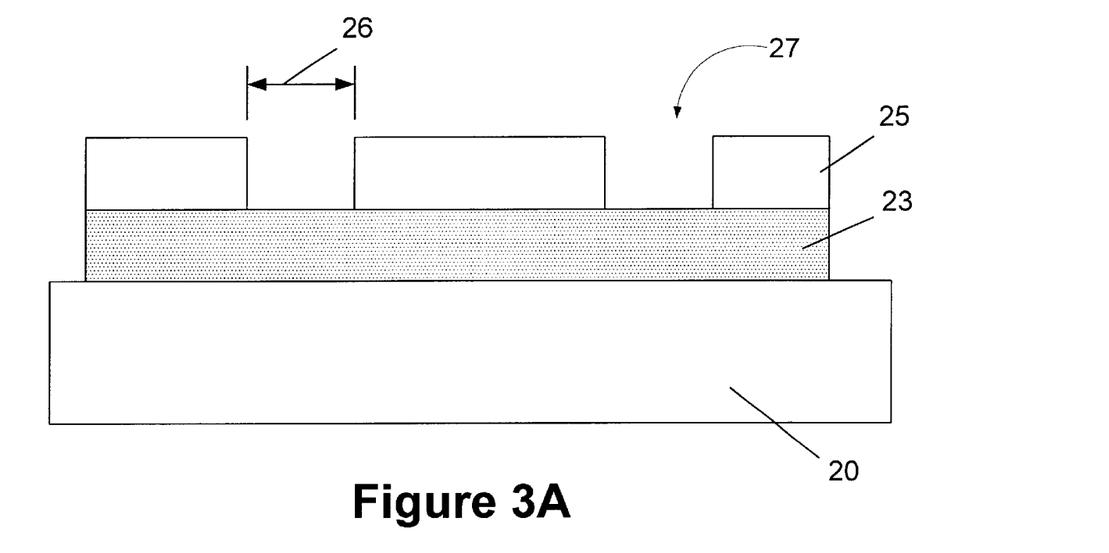
FIGS. 3A–3C are cross-sectional views depicting patterning operations performed on another illustrative wafer having a layer of photoresist and a process layer formed thereabove.
Figure 3B:
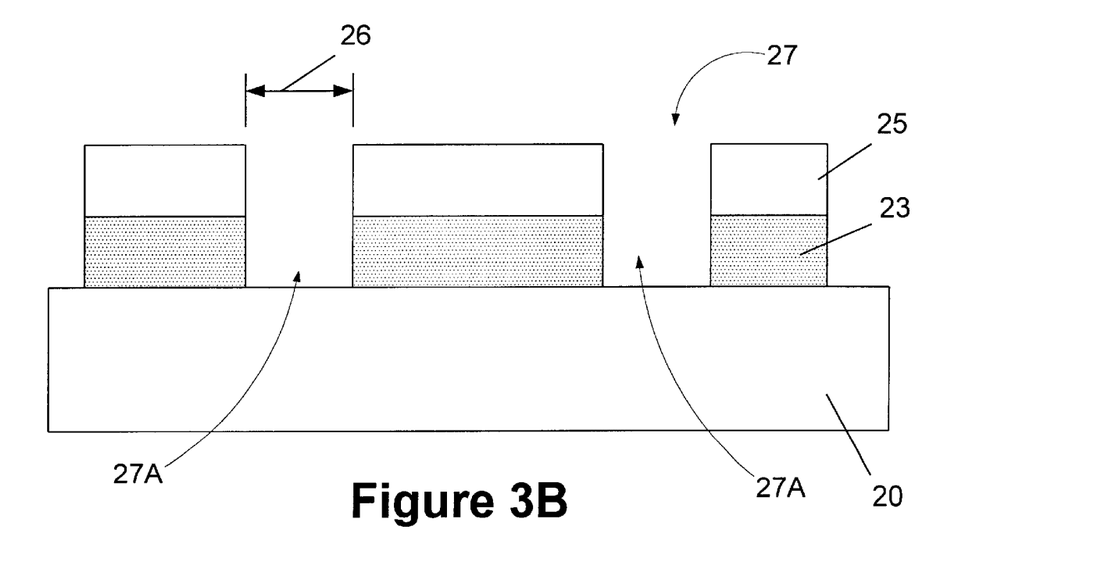
Figure 3C:
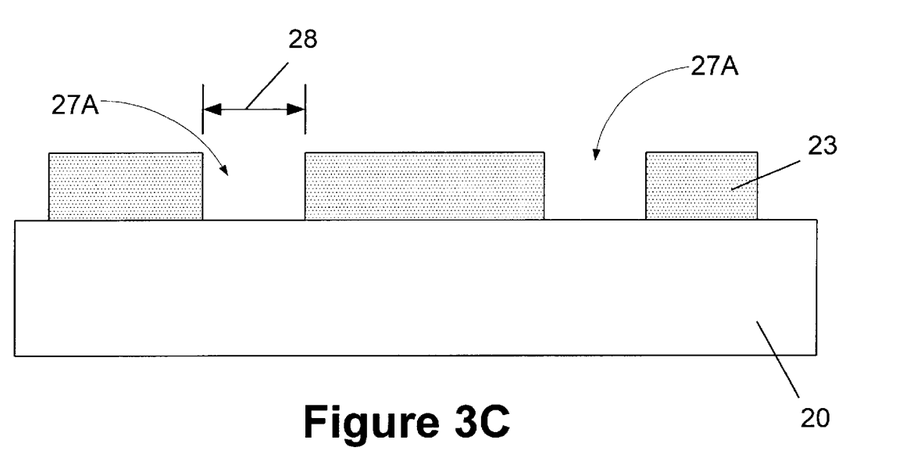

FIGS. 3A–3C depict yet another illustrative embodiment where openings are formed in the underlying process layer 23 using known photolithography and etching techniques. For example, as shown in FIG. 3A, the layer of photoresist 25 has a plurality of openings 27 formed therein using known photolithography techniques. Thereafter, by performing one or more etching processes, and using the patterned layer of photoresist 25 as a mask, the underlying process layer 23 is etched resulting in openings 27A being formed in the process layer 23 that correspond with the openings 27 in the layer of photoresist 25. FIG. 3C depicts the situation where the patterned layer of photoresist 25 has been removed. The openings 27A in the process layer 23 may be openings in an insulating layer wherein conductive interconnections, i.e., conductive copper lines, contacts, vias, etc., may be formed. The openings 27 in the layer of photoresist 25 have a critical dimension 26, as indicated in the drawings, that may also be referred to as a DICD dimension. Similarly, the openings 27A formed in the process layer 23 have a critical dimension 28, as indicated in FIG. 3C, that may also be referred to as an FICD measurement, in that it reflects the actual critical dimension 28 of the as-fabricated openings 27 in the process layer 23.

During the course of photolithographic processes, the layer of photoresist material 25 is exposed to a light source (not shown) that is projected through a reticle (not shown) in a stepper tool, using known photolithographic techniques. On a theoretical basis, the image set. forth in the reticle would be precisely replicated in the layer of photoresist material, but on a much smaller scale given the optical reduction capabilities of modern stepper tools. However, in practice, there is virtually always a difference between the critical dimension of a feature reflected on a reticle as compared to the critical dimension of that feature as formed in the patterned layer of photoresist, e.g., the critical dimension 22 or 26, so-called DICD dimensions. There may be many causes for such variations. For example, lenses may become dirty, light sources may become weaker with use, variations in the qualities or characteristics of the photoresist material, recipe variations, etc.

The variation between the critical dimensions of the features on the patterned layer of photoresist 25, i.e., DICD dimensions, and those that would otherwise theoretically be expected to be formed based upon the critical dimensions of the features formed on the reticle, may be considered to represent a photo offset ("d"). Typically, in modern semiconductor manufacturing operations, this offset is very small, e.g., on the order of approximately 60–70 nm. This photo offset will vary from stepper tool to stepper tool, or at least types of stepper tools. In general, it is desirable that this photo offset be as small as possible, and approximately constant. However, practice has shown that the photo offset varies over time, and depending upon the types of devices to be constructed.

Similarly, but for entirely different reasons, when etching an underlying process layer, e.g., the process layer 23, using a patterned layer of photoresist as a mask, there is a difference between the critical dimension (DICD) of the feature formed in the patterned layer of photoresist, and the resulting critical dimension (FICD) of the as-fabricated feature in the underlying process layer. For example, with reference to FIGS. 2B–2D, the critical dimension 24 (FICD) of the feature 23A formed in the process layer 23 may be greater than or less than the critical dimension 22 (DICD) of the photoresist feature 25A shown in FIG. 2D. In. a similar sense, with respect to FIGS. 3A–3C, the critical dimension 28 (FICD) of the openings 27A formed in the process layer 23 may be greater than or less than the critical dimension 26 (DICD) of the openings 27 formed in the photoresist layer 25 shown in FIG. 3A. This variation may be referred to as an etch offset ("c"). There are a variety of reasons why the etch offset may be present. For example, the etch tool in which etching processes are performed may become dirty, constituent gases used in the etching process may vary in quality, general etch tool degradation, etc. Moreover, this etch offset may vary from etch tool to etch tool, or at least by type or manufacturer of etch tool. This etch offset may vary, but it typically ranges between approximately 2.5–3.5 nm. Ideally, this etch offset would be a relatively small value and it will remain relatively constant. However, experience has indicated that this etch offset does vary somewhat irrespective of efforts to control it.

Figure 4:
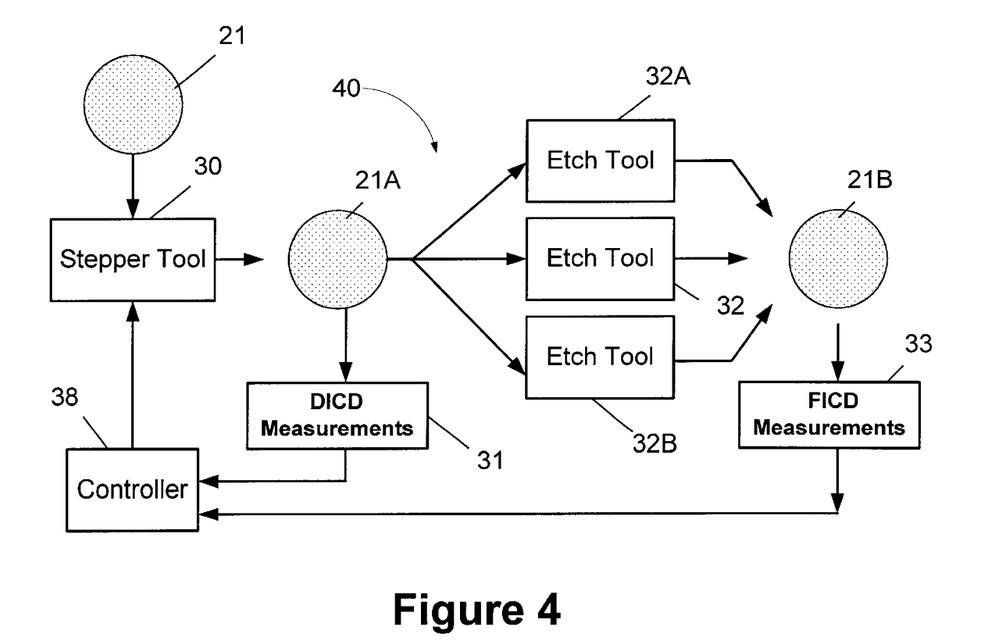
FIG. 4 depicts an illustrative embodiment of a system in accordance with one embodiment of the present invention.

An illustrative system 40 that may be used in one embodiment of the present invention is shown in FIG. 4. The system 40 is comprised of a stepper tool 30, one or more etch tools 32, 32A, 32B, and a controller 38. As indicated in FIG. 4, one or more wafers 21, having a layer of photoresist (not shown) formed above an underlying process layer (not shown) are subjected to an exposure process in the stepper tool 30 whereby an image on a reticle will be projected onto the layer of photoresist. After subsequent photoresist developing procedures are performed, the wafers 21 have a patterned layer of photoresist formed thereon, as represented by the illustrative wafer 21A. Thereafter, the wafers 21A are provided to at least one of the illustrative etch tools 32, 32A, 32B wherein etching processes are performed to define a feature in the underlying process layer. Wafers exiting the etch tool, having such features, e.g., openings, lines, etc., defined in the process layer, are indicated by the wafer 21B.

As indicated in FIG. 4, in one embodiment, the critical dimensions of the features formed in the layer of photoresist, i.e., DICD dimension, are measured, as indicated in block 31. The critical dimension (FICD) of the as-fabricated features formed in the process layer are measured as indicated in the block 33. In the particular embodiment of the invention illustrated in FIG. 4, both the DICD measurements 31 and the FICD measurements 33 are provided to a controller 38, which is used to determine or adjust an exposure dose of the stepper 30 based upon the DICD and FICD measurements. That is, in the depicted embodiment, both the DICD measurements 31 and the FICD measurements 33 are used to determine or adjust the exposure dose of the stepper 30 on subsequently processed wafers such that the FICD of as-fabricated features is maintained within acceptable limits. In this manner, features, e.g., gate electrodes, line widths, openings in insulation layers, etc., may be more accurately formed in integrated circuit devices, thereby enhancing device performance, and reducing costly rework when such errors are of an unacceptable level. The DICD measurements 31 and the FICD measurements 33 may be performed by a variety of tools capable of performing such measurements, e.g., an ellipsometer, a scanning electron microscope, etc. For example, DICD measurements may be made using a KLA 8100 CD SEM, and FICD measurements may be made using an OPAL 7830i CD SEM. Both of these tools can measure critical dimensions for line widths and spacing and for contact holes. Moreover, the DICD measurements 31 and the FICD measurements 33 fed to the controller 38 may be an average or a statistical sampling of a number of measurements made on one or more wafers at a plurality of locations across the wafer(s).

As will be recognized by those skilled in the art upon a complete reading of the present application, the present invention may also be employed in situations in which only the FICD measurements 33 are used to control the exposure dose of the stepper 30. Additionally, in some embodiments, only the DICD measurements 31 may be used to control the exposure dose of the stepper 30. Adjustments to the exposure dose may be made on a flash-by-flash basis as the stepper 30 steps across the wafer. Alternatively, the exposure dose may be set to one uniform value that will be performed on all of the die formed on the wafer. The exact parameters and techniques for implementation of the present invention may be varied to suit the particular integrated circuit devices under construction.

The interrelationship of the various parameters discussed above may also be expressed in terms of the following equations:

$$FICD = DICD + c \quad (1)$$

$$DICD = \gamma (\text{exposure dose}) + d \quad (2)$$

In the above equations, "c" is the etch offset and "d" is the photo offset. In Equation (2), the term "$\gamma$" is a factor that reflects the relationship between the exposure dose used in a stepper tool to the DICD of the feature to be defined in the patterned layer of photoresist. The value of the $\gamma$ factor may vary somewhat depending upon the tool, the photoresist layer and the device under construction. "$\gamma$" is the relationship between DICD and exposure dose. When patterning a line-type feature, $\gamma$ will be a negative value; when patterning a hole-type feature, e.g., a trench or a contact hole, $\gamma$ will be positive. For example, a $\gamma$ factor of −0.029 mm/mJ means that for every 1 mJ increase in exposure dose, the DICD will decrease by 0.029 $\mu$m. Thus, by varying the exposure dose of the exposure process performed on a layer of photoresist in a stepper tool, the DICD of features formed in the layer of photoresist, and ultimately the FICD of features formed in underlying process layers, may be controlled or at least maintained within acceptable limits.

By way of example only, take the situations where the features to be formed in the underlying process layer are line-type features, e.g., conductive metal lines, gate electrodes, etc. If the FICD measurements 33 of fabricated features indicate that the lines have been formed with a critical dimension that is wider than desired, then the controller 38, based upon these FICD measurements 33, may increase the exposure dose on subsequently processed wafers to thereby reduce the critical dimension of fabricated line-type features on subsequently processed wafers. Conversely, if the FICD measurements 33 indicate that the line-type features have been formed with a critical dimension that is less than desired, the exposure dose on subsequent wafers may be decreased, thereby increasing the critical dimension of the line-type features on subsequently processed wafers.

A similar relationship exists with respect to the DICD measurements 31 of line-type features. That is, if the DICD measurements 31 indicate greater than desired critical dimensions of the photoresist features, the controller 38 may increase the exposure dose on subsequently processed wafers. Conversely, if the DICD measurements 31 indicate that the critical dimensions of the photoresist features are less than a desired target value, the exposure dose of the exposure process performed on subsequently processed wafers may be decreased to thereby increase the critical dimension of features formed in photoresist layers on subsequently processed wafers. Moreover, as stated above, the DICD measurements 31 and FICD measurements 33 may be used independently or together by the controller 38 to control the exposure dose of an exposure process to be performed on subsequently processed wafers.

In the case of forming openings in process layers, such as the openings 27A formed in the process layer 23 shown in FIG. 3C, the adjustment of the exposure dose is opposite to the adjustment of the exposure dose for line-type features. That is, if the FICD measurements 33 of the openings 27A indicate that the critical dimension 28 of the openings 27A is greater than desired, the controller 38 may reduce the exposure dose on subsequently processed wafers, thereby reducing the critical dimension 28 of the openings 27A. Conversely, if the FICD measurements 33 of opening-type features indicates that the critical dimension 28 is too small, the exposure dose may be increased. The same relationship applies with respect to DICD measurements 31 of opening-type features. That is, if the DICD measurements 31 of the critical dimension 22 of openings 27A in a layer of photoresist indicate that the critical dimension 22 is too large, the exposure dose may be decreased on subsequently processed wafers. Conversely, if the DICD measurements 31 indicate that the critical dimension 22 is too small, the exposure dose may be increased. As stated above, the DICD measurements 31 and FICD measurements 33 may each be used independently or together by the controller 38 to control the exposure dose of the exposure process performed in the stepper.

The critical dimension measurements, both DICD measurements 31 and/or FICD measurements 33, may be performed on any desired number of wafers. For example, such critical dimension measurements may be performed on all wafers in one or more lots, or on a representative number of wafers in a given lot, and these results may then be used to vary the exposure dose of the stepper tool on subsequent wafers. Additionally, more than one lot of wafers may be analyzed until such time as the process engineer has achieved a sufficiently high degree of confidence that the testing accurately reflects the critical dimensions of the features under construction.

In the illustrated embodiment, the controller 38 is a computer programmed with software to implement the functions described herein. Moreover, the functions described for the controller 38 may be performed by one or more controllers spread through the system. For example, the controller 38 may be a fab level controller that is used to control processing operations throughout all or a portion of a semiconductor manufacturing facility. Alternatively, the controller 38 may be a lower level computer that controls only portions or cells of the manufacturing facility. Moreover, the controller 38 may be a stand-alone device, or it may reside on the tool 30 or on a photolithography module (not shown). However, as will be appreciated by those of ordinary skill in the art, a hardware controller (not shown) designed to implement the particular functions may also be used.

Portions of the invention and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the actions and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

An exemplary software system capable of being adapted to perform the functions of the controller 38, as described, is the Catalyst system offered by KLA Tencor, Inc. The Catalyst system uses Semiconductor Equipment and Materials International (SEMI) Computer Integrated Manufacturing (CIM) Framework compliant system technologies, and is based on the Advanced Process Control (APC) Framework. CIM (SEMI E81-0699-Provisional Specification for CIM Framework Domain Architecture) and APC (SEMI E93-0999-Provisional Specification for CIM Framework Advanced Process Control Component) specifications are publicly available from SEMI.

The present invention is directed to an automated method of controlling critical dimensions of features by controlling the stepper exposure dose, and a system for accomplishing same. In one embodiment, the method comprises measuring a critical dimension 24, 28 of a plurality of features 23A, 27A formed in a process layer 23 formed on a wafer, providing the measured critical dimensions of the features to a controller 38 that determines, based upon the measured critical dimensions, an exposure dose of an exposure process to be performed on at least one subsequently processed wafer, forming a layer of photoresist above a process layer formed above said subsequently processed wafer, and performing the exposure process on the layer of photoresist on the subsequently processed wafer using the determined exposure dose.

In another embodiment, the method comprises measuring a critical dimension 22, 26 of a plurality of features 25A, 27 formed in a patterned layer of photoresist that is formed above a process layer formed on a wafer, providing the measured critical dimensions of the features in the patterned layer of photoresist to a controller 38 that determines, based upon the measured critical dimensions, an exposure dose of an exposure process to be performed on at least one subsequently processed wafer, forming a layer of photoresist above a process layer formed above a subsequently processed wafer, and performing the exposure process on the layer of photoresist on the subsequently processed wafer using the determined exposure dose.

In yet another embodiment, the method comprises measuring a critical dimension 22, 26 of a plurality of features 25A, 27 formed in a patterned layer of photoresist that is formed above a process layer formed on a wafer, measuring a critical dimension 24, 28 of a plurality of features 23A, 27A formed in a process layer formed on a wafer, providing the measured critical dimensions of the features in the patterned layer of photoresist and the features in the process layer to a controller 38 that determines, based upon the measured critical dimensions, an exposure dose of an exposure process to be performed on at least one subsequently processed wafer, forming a layer of photoresist above a process layer formed above a subsequently processed wafer, and performing the exposure process on the layer of photoresist on the subsequently processed wafer using the determined exposure dose.

In one illustrative embodiment, the system disclosed herein comprises a metrology tool for determining a critical dimension of a plurality of features 23A, 27A formed in a process layer 23 formed on a wafer, a controller that determines, based upon the measured critical dimensions of the features, an exposure dose of an exposure process to be performed on at least one subsequently processed wafer, and a stepper tool that performs the exposure process on the at least one subsequently processed wafer using the determined exposure dose.

In another embodiment, critical dimensions of a plurality of features 25A, 27 formed in a patterned layer of photoresist are provided to the controller 38, and those critical dimensions, alone or in addition to the critical dimensions of the process layer, are used to determine the exposure dose on subsequent wafers.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   measuring a critical dimension of a plurality of features formed in a patterned layer of photoresist that is formed above a process layer formed on a wafer;
   measuring a critical dimension of a plurality of features formed in a process layer formed on a wafer;
   providing said measured critical dimensions of said features in said patterned layer of photoresist and said features in said process layer to a controller that determines, based upon said measured critical dimensions of said features in said patterned layer of photoresist and said features in said process layer, an exposure dose of an exposure process to be performed on at least one subsequently processed wafer;
   forming a layer of photoresist above a process layer formed above a subsequently processed wafer; and
   performing said exposure process on said layer of photoresist on said subsequently processed wafer using said determined exposure dose.

2. The method of claim 1, wherein said plurality of features in said process layer comprises at least one of a plurality of gate electrodes, a plurality of lines, and a plurality of openings in said process layer.

3. The method of claim 1, wherein said controller is resident on a stepper tool used to perform said exposure process on said subsequently processed wafer.

4. The method of claim 1, wherein measuring a critical dimension of a plurality of features in said patterned layer of photoresist and said features in said process layer comprises measuring a critical dimension of a plurality of features in said patterned layer of photoresist and said process layer using a scanning electron microscope.

5. The method of claim 1, wherein forming a layer of photoresist comprises forming a layer of photoresist by a spin-coating process.

6. The method of claim 1, wherein said process layer having said layer of photoresist formed thereabove is comprised of at least one of a metal, polysilicon, and an insulating material having a dielectric constant greater than approximately 3.

7. The method of claim 1, wherein said exposure dose of said exposure process is increased if said features in said process layer are line-type features and said measured critical dimensions of said features in said process layer are greater than a desired critical dimension.

8. The method of claim 1, wherein said exposure dose of said exposure process is decreased if said features in said process layer are line-type features and said measured critical dimensions of said features in said process layer are less than a desired critical dimension.

9. The method of claim 1, wherein said exposure dose of said exposure process is decreased if said features in said process layer are opening-type features and said measured critical dimensions of said features in said process layer are greater than a desired critical dimension.

10. The method of claim 1, wherein said exposure dose of said exposure process is increased if said features in said process layer are opening-type features and said measured critical dimensions of said features in said process layer are less than a desired critical dimension.

11. The method of claim 1, further comprising:
    providing a plurality of additional wafers, each of which have a layer of photoresist formed thereabove;
    and performing said exposure process on said layer of photoresist formed above each of said additional wafers.

* * * * *